(12) United States Patent
Goetzenberger

(10) Patent No.: US 9,438,222 B2
(45) Date of Patent: Sep. 6, 2016

(54) METHOD, CONTROL UNIT AND SWITCHING DEVICE FOR SWITCHING A CYCLE IN A POWER TRANSISTOR CIRCUIT

(71) Applicant: CONTINENTAL AUTOMOTIVE GMBH, Hannover (DE)

(72) Inventor: Martin Goetzenberger, Ingolstadt (DE)

(73) Assignee: Continental Automotive GmbH, Hannover (DE)

( * ) Notice: Subject to any disclaimer, the term of this patent is extended or adjusted under 35 U.S.C. 154(b) by 77 days.

(21) Appl. No.: 14/514,589

(22) Filed: Oct. 15, 2014

(65) Prior Publication Data
US 2015/0102851 A1 Apr. 16, 2015

(30) Foreign Application Priority Data
Oct. 15, 2013 (DE) .......... 10 2013 220 842

(51) Int. Cl.
*G06F 1/08* (2006.01)
*H03K 17/14* (2006.01)
(52) U.S. Cl.
CPC .................. *H03K 17/145* (2013.01)

(58) Field of Classification Search
USPC .......................................... 327/99
See application file for complete search history.

(56) References Cited

U.S. PATENT DOCUMENTS

2012/0229942 A1* 9/2012 Hussein ............ H03K 17/0828
361/57
2012/0280728 A1* 11/2012 Hussein ............... H03K 17/127
327/155

FOREIGN PATENT DOCUMENTS

JP 2009017727 A 1/2009
WO 0059087 A1 10/2000

* cited by examiner

*Primary Examiner* — Lincoln Donovan
*Assistant Examiner* — Patrick Chen
(74) *Attorney, Agent, or Firm* — Laurence A. Greenberg; Werner H. Stemer; Ralph E. Locher

(57) ABSTRACT

A method for switching a cycle in a power transistor circuit is created, especially in a parallel circuit of power transistors. The method includes the step of specifying a switching time difference and the switching of the power transistors of two switching times which are separate from one another by use of the switching time difference.

2 Claims, 2 Drawing Sheets

METHOD, CONTROL UNIT AND SWITCHING DEVICE FOR SWITCHING A CYCLE IN A POWER TRANSISTOR CIRCUIT

CROSS-REFERENCE TO RELATED APPLICATION

This application claims the priority, under 35 U.S.C. §119, of German application DE 10 2013 220 842.1, filed Oct. 15, 2013; the prior application is herewith incorporated by reference in its entirety.

BACKGROUND OF THE INVENTION

Field of the Invention

The invention relates to a method for switching a cycle in a power transistor circuit, especially in a parallel circuit of power transistors. Furthermore, the invention relates to a control unit and to a switching device.

Power transistors are used inter alia in electronic ballasts and in transformers. Power transistors are configured to switch and/or to control large currents. If greater currents occur than can be switched by a single power transistor, the current is distributed typically to a number of power transistors in one circuit. In the case of a parallel circuit of power transistors, the problem of asymmetric heating of a single one of the power transistors connected in parallel may occur caused by the component since the individual power transistors have typically at least slightly different characteristics and thus losses including switching losses and line losses occur in different magnitude. When the power transistor is switched into a conducting state, switching losses occur as a result of which the power transistor heats up. Such heating of the power transistor leads, on the one hand, to an increase in the line losses and, on the other hand, to a decrease in a threshold voltage above which the power transistor conducts current.

In a parallel circuit of a number of power transistors, one of the power transistors usually has the lowest threshold voltage due to component variations. As a consequence, this power transistor bears almost all the switching losses of the circuit. This will result in an asymmetric distribution of switching losses and thus to an asymmetric heating over the circuit.

Known approaches to solving the problem of asymmetric heating are fast switching of the power transistors, the parasitic inductive characteristics leading to a certain balancing of the switching losses.

As an alternative, power transistors are used which are selected for particular equality of their characteristics or parameters and which thus have little variation of the parameters but are expensive due to the selection effort required for this purpose.

In spite of these measures, a certain asymmetry remains in most cases which is typically compensated for by over-dimensioning the output stage.

SUMMARY OF THE INVENTION

An object of the invention can be seen in providing an alternative simplified method for switching power transistors.

The object is achieved by a method, a control unit and a switching device according to the independent claims.

Advantageous embodiments, further features and details of the present invention are found in the dependent claims.

According to an exemplary aspect, a method for switching a switching cycle in a power transistor circuit is created which has a first power transistor and a second power transistor which is connected in parallel with the first power transistor. The method includes specifying of a switching time difference of greater than zero between a first switching time of a predetermined type and a second switching time of the predetermined type for a first switching cycle. Furthermore, the method includes switching of the first power transistor at the first switching time and switching the second power transistor at the second switching time. In this context, the predetermined type is selected from a group consisting of a switching-on time and a switching-off time.

In particular, the switching time can be a switching-on time. In this case, a power transistor is switched on at an earlier time and the other power transistor is switched on at a later time which is different from the first time by the switching time difference. Due to the intended, deliberately earlier switching-on of one of the power transistors, the latter generally takes over all the switching-on losses. If there is a number of power transistors connected in parallel, all the switching losses occurring can thus be allocated selectively to one of the power transistors. A switching time difference of greater than zero between a first switching time and a second switching time means in this case that the first switching time is temporally after the second switching time whereas a switching time difference of less than zero between a first switching time and a second switching time would mean that the first switching time is temporally before the second switching time.

As an alternative or additionally, the switching time can be a switching-off time. In this case, one of the power transistors is switched off before the other power transistor by a switching time difference. The power transistor switched off first delivers its current to the other power transistor. The power transistor switched off last then bears all the switching-off losses.

In particular, the switching time difference can be 5 microseconds to 250 microseconds and preferably between 50 microseconds and 100 microseconds.

The switching losses can be allocated selectively to a preselected power transistor both for the switching-on and for the switching-off of power transistors connected in parallel with one another which results in an asymmetric distribution of switching losses over the power transistor circuit, simplifying the procedure or control, respectively. Due to the selective allocation of the switching losses in one cycle, the switching losses can be allocated to a different power transistor in each case in the power transistor circuit in each cycle of a preferably periodic sequence of cycles during the switching-on and/or during the switching-off of a power transistor. The switching losses are thus distributed uniformly to the power transistors over a period of the sequence of cycles in the mean.

Such a power transistor circuit can be used especially in the automotive industry, for example for switching an electric motor, a catalyzer heater or similar applications in which a high power needs to be switched.

According to one exemplary aspect, a control unit for switching a power transistor circuit is created, the control unit being configured in such a manner that it can perform the method according to the exemplary aspect.

In particular, the control unit can be configured in such a manner that it specifies or determines the switching time differences.

In particular, the control unit can be configured in such a manner that in the case of a predetermined switching time difference of greater than zero between a first switching time of a predetermined type and a second switching time of the predetermined type for a first switching cycle, it switches the first power transistor at the first switching time and switches the second power transistor at the second switching time, the predetermined type being selected from a group consisting of a switching-on time and a switching-off time.

According to one exemplary aspect, a switching device is created which has the control unit and a power transistor circuit, the power transistor circuit having two power transistors which are connected in parallel with one another.

In the case of a temporally periodic signal, the term "cycle" or "switching cycle" can be understood to be the time period, i.e. the interval in which the signal is repeated both in amplitude and in phase. A "cyclic signal" is thus mentioned especially when the signal exhibits homogeneous or similar, periodically repetitive events.

The term "power transistor" can be understood to be a transistor which is configured for switching or controlling large currents and/or powers. In this context, large powers can be considered to be powers, in particular, which are in the range from 100 W to 10 kW and currents which are in the range of 10 A to 1000 A. In particular, such a power transistor must be distinguished from a transistor which is used to switch logic signals as is used, for example, in a processor unit.

The term "switching time difference" can be understood to be the time interval which is between two switching events, for example between the switching-on of two power transistors or the switching-off of two power transistors. The switching time difference between an event A and an event B can also be described by the term t(A)−t(B). In this context, it must be noted, in particular, that a switching time difference between two switching events is intended or deliberate, and thus is not intended to be understood as the much smaller unavoidable component-related time fluctuation during the driving of components.

The term "switching time" can be understood to be a time at which a switching event is initiated at a transistor. The switching event may be initiated in this case, for example, by a logic signal of a microcontroller or control unit. The term "switching-on time" can designate the time at which a transistor is switched on, a "switched-on transistor" also being mentioned in the text which follows when the transistor is in a conducting state. Correspondingly, the term "switching-off time" can designate the time at which the transistor is switched off, i.e. is switched into a non-conducting state.

The method according to an exemplary aspect can provide the advantage that it is possible to control selectively to which of the power transistors the switching losses are allocated during switching-on and/or switching-off. By this means, it is possible to achieve a desired asymmetry of switching losses and heating via the power transistor circuit within one cycle.

An exemplary concept of the invention can be seen in the fact that a method is created which allocates the switching losses, and thus the heating, selectively to a certain power transistor in the circuit. In this case, however, this asymmetry is no longer randomly determined by the characteristic values of the relevant transistors but can be selectively controlled. By this means, it is possible that overheating can be prevented by selective controlling of the power transistors or at least the risk can be reduced. For example, the power transistor which is switched on before the other power transistor, or is switched off as the last one, can be dimensioned preferably to be larger in order to reduce the effects on the total circuit. As an alternative, it can be possible that the power transistor which is switched on as the first one or switched off as the last one is changed from cycle to cycle.

In the text which follows, exemplary embodiments of the method are described. However, the corresponding embodiments and features also apply to the control unit and the switching device.

According to one exemplary embodiment, the method also exhibits the specifying of a further switching time difference of greater than zero between a third switching time of a further predetermined type and a fourth switching time of the further predetermined type for the first switching cycle. Furthermore, the method exhibits the switching of the first power transistor at the third switching time which is different from the first switching time, and the switching of the second power transistor at the fourth switching time, the first switching time and the second switching time being one of a switching-on time and a switching-off time and the third switching time and the fourth switching time being the other one of a switching-off time and a switching-on time.

In particular, in a temporal sequence, first the second power transistor can be switched off and subsequently the first power transistor can be switched off. The switching losses during the switching-off are thus allocated to the first power transistor. During the switching-on, it is possible to proceed in the reverse order, first, the second power transistor can be switched on and subsequently the first power transistor can be switched on. The switching losses during the switching-on can thus be allocated to the second power transistor. This can provide the advantage that the increase in temperature associated with the switching losses, which could lead to overheating, can be distributed to both transistors.

According to an exemplary embodiment, the third switching time is after the second switching time.

In particular, in a temporal sequence, first the second power transistor can be switched on and subsequently the first power transistor can be switched on. During the switching-off, it is possible to proceed, in particular, in the same order, first, the second power transistor can be switched off and subsequently the first power transistor can be switched off. The second power transistor thus bears the switching-on losses and the first power transistor bears the switching-off losses. This may provide the advantage that the heating associated with the losses can be distributed to both transistors so that an asymmetric overheating of one of the power transistors can be avoided. In contrast to the known methods in the prior art, in which it is attempted to reduce the inequalities of the power transistors (for example by the selection of specific, similar power transistors) in order to thus prevent overheating, it is not attempted, according to the exemplary embodiment, to compensate for any asymmetry of the power transistors but this is even deliberately increased within one switching cycle in that one of the power transistors is selectively switched on earlier and/or off later. Although, this increases the asymmetry at a given time which, in principle, would increase the risk of overheating. However, since the power transistors which are switched on earlier or off later are changed between different switching cycles, the asymmetry is reduced over a larger number of switching cycles overall.

According to one exemplary embodiment, the method also exhibits the specifying of a third switching time difference of less than zero between a fifth switching time of the predetermined type and a sixth switching time of the predetermined type for a subsequent second switching cycle. Furthermore, the method exhibits the switching of the first power transistor at the fifth switching time and the switching of the second power transistor at the sixth switching time.

In particular, the first power transistor can bear the switching-on losses in the first cycle while the second power transistor bears the switching-on losses in the subsequent cycle. By selective alternating asymmetric allocation of the switching losses, the switching losses are distributed uniformly over all power transistors of the circuit in the temporal mean.

In particular, the second power transistor can be switched on before the first power transistor in a first cycle and thus bear the switching-on losses. In a second subsequent cycle, the first power transistor can be switched on first and thus bear the switching-on losses. The transistor which bears the switching-on losses can thus be changed from cycle to cycle. The consequence of this is that the switching losses are distributed uniformly in a temporal mean.

Symmetrization over a temporal mean can provide the advantage that there will be no overheating of an individual power transistor in the power transistor circuit even if the power transistors have characteristic values which differ from one another relatively distinctly. It is thus possible to dispense with expensive selected power transistors. It is also possible to dispense with over-dimensioning of the output stages in the power transistor circuit.

According to one exemplary embodiment, the method also exhibits the specifying of a fourth switching time difference of less than zero between a seventh switching time of the further predetermined type and an eighth switching time of the further predetermined type for the second switching cycle. Furthermore, the method exhibits the switching of the first power transistor at the seventh switching time and the switching of the second power transistor at the eighth switching time.

In particular, the seventh switching time can be after the sixth switching time. This makes it possible to provide two successive cycles in which the power transistors bear both the switching-on losses and the switching-off losses alternately.

According to one exemplary embodiment, the power transistor circuit also has a third power transistor, the method also exhibiting the switching of the third power transistor at switching times which are different from at least one of the switching times of the first and second power transistor.

In particular, the third power transistor can be connected in parallel with the first power transistor, i.e. all three transistors are operated in a parallel circuit.

In particular, one of the three power transistors can switch a switching time difference offset from the other two power transistors. In other words, the power transistors switch on and/or off at least at two different times with each edge of one cycle.

In particular, the circuit arrangement can be configured in such a manner that the three power transistors are switched on alternately as the first one in the course of three successive switching cycles and thus bear the switching-on losses.

In particular, the three power transistors can also be switched off alternately as the last one in the course of successive switching cycles and thus bear the switching-off losses.

In particular, the first power transistor can switch on as the first one in the first cycle, the second power transistor can switch off as the last one and the third power transistor can cool down in that it neither switches on as the first one nor switches off as the last one. In the subsequent second cycle, in particular, the second power transistor can then switch on as the first one, the third power transistor can switch off as the last one and the first power transistor can cool down in that it neither switches on as the first one nor switches off as the last one. In this manner, the power transistors can alternate in bearing the switching-on losses and the switching-off losses. The associated heating of the power transistors can thus be distributed uniformly to the power transistors in the circuit over a temporal mean.

The term "cool down" can here be understood to mean that the power transistor bears neither the switching-on losses nor the switching-off losses in the cycle and thus there is no significant heating due to switching losses on this transistor.

According to an exemplary embodiment, each of the power transistors switches on as the first one in each third switching cycle and/or off as the last one in each third switching cycle.

In particular, the power transistors can be switched in such a manner that one of the power transistors does not bear both the switching-on losses and the switching-off losses within the same cycle.

The term "in each third switching cycle" can mean generally that with a predetermined number of switching cycles, each third one, i.e. one third of all switching cycles, is affected. In particular, however, it can also mean that in a temporal sequence of switching cycles, each third switching cycle, i.e., e.g. the first, the fourth, the seventh etc. switching cycle is affected.

According to one exemplary embodiment, the power transistor circuit has a total number of n power transistors connected in parallel, the method also exhibiting switching one of the n power transistors at a switching time which is different from the switching times of the respective other power transistors.

In particular, one of the n power transistors can switch on and/or off at a different switching time from the other ones of the n power transistors. In particular, the other ones of the n power transistors can switch at the same time. For example, one power transistor can be switched at the first switching time while the other power transistors are switched at the second switching time. As an alternative, one power transistor can be switched at the second switching time whilst the other power transistors are switched at the first switching time.

The term "total number" can be understood to mean, in particular, the number of power transistors which are present overall in the power transistor circuit. The total number n can include both the number of power transistors connected in parallel and a number of further power transistors which, for example, may be connected in series with the power transistors connected in parallel. The total number of power transistors thus exhibits, in particular, the first power transistor and the second power transistor and possibly also the third, fourth and fifth power transistor.

According to one exemplary embodiment, each of the power transistors switches on as the first one in each n-th switching cycle and/or switches off as the last one in each n-th switching cycle.

In particular, the transistor circuit can have more than three transistors connected in parallel. In a transistor circuit having a total number of n transistors connected in parallel, each of the transistors can bear the switching-on losses in each n-th cycle, bear the switching-off losses in each n-th cycle and cool down in the remaining n−2 cycles.

According to one exemplary embodiment, the power transistor circuit has a first stage which has m power transistors connected in parallel, and a second stage which has i power transistors connected in parallel, each of the m+i power transistors switching the power transistor circuit to be conductive in each m+i-th switching cycle and/or switching the power transistor circuit to be nonconductive in each m+i-th switching cycle.

In particular, the total number n can consist of the number of power transistors of the first stage m and the number of power transistors of the second stage i so that n=m+i applies.

According to one exemplary embodiment, the power transistor circuit has a first stage which has the first and the second power transistor. Additionally, the power transistor circuit has a second stage which has a fourth and a fifth power transistor, the fourth and fifth power transistor being connected in parallel with one another, each of the four power transistors switching the power transistor circuit to be conductive in each fourth switching cycle and/or switching the power transistor circuit to be nonconductive in each fourth switching cycle.

In particular, the first stage can be connected in series with the second stage.

In particular, one of the stages can be provided as a redundant option for switching off the power transistor circuit. In this manner, an additional safety function can be provided by a redundant emergency switch-off.

The term "switching to be conductive" can be understood to mean, in particular, that the corresponding transistor switches the entire transistor circuit or circuit arrangement to be conductive. In the case of a series circuit of two stages, for example, this is not necessarily the first transistor which is switched to be conductive but the first transistor of a stage which is switched to be conductive when the other stage is already switched to be conductive which occurs wattlessly, i.e. the other stage is switched without any power being switched on this occasion.

Conversely, the term "switching to be nonconductive" can be understood to mean, in particular, that the corresponding transistor is the transistor which switches the entire transistor circuit to be nonconductive. In the case of a series circuit of two stages, for example, this is not necessarily the last transistor which is switched to be nonconductive but the last transistor of a stage which is switched to be nonconductive even if the other stage is still switched to be conductive which can then be subsequently switched off wattlessly.

According to one exemplary embodiment, at least one of the power transistors in the switching device is an FET according to one exemplary aspect.

In particular, at least one of the power transistors can be a MOSFET.

Other features which are considered as characteristic for the invention are set forth in the appended claims.

Although the invention is illustrated and described herein as embodied in a method, a control unit and a switching device for switching a cycle in a power transistor circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

It is pointed out that features and components of different embodiments which are identical or at least functionally identical with the corresponding features or components of the embodiment are provided with the same reference symbols or with other reference symbols which differ only in their first digit from the reference symbol of a functionally corresponding feature or a functionally corresponding component. To avoid unnecessary repetitions, features or components, already partially explained by means of an embodiment described previously, will no longer be explained in detail at a later place.

It is also pointed out that the embodiments or exemplary embodiments described in the text which follows represent only a limited selection of possible variants of the embodiments of the invention. In particular, it is possible to combine the features of individual embodiments with one another in a suitable manner so that a multiplicity of various embodiments can be considered as obviously disclosed to the expert with the variants of the embodiments shown here explicitly.

Figure 1:
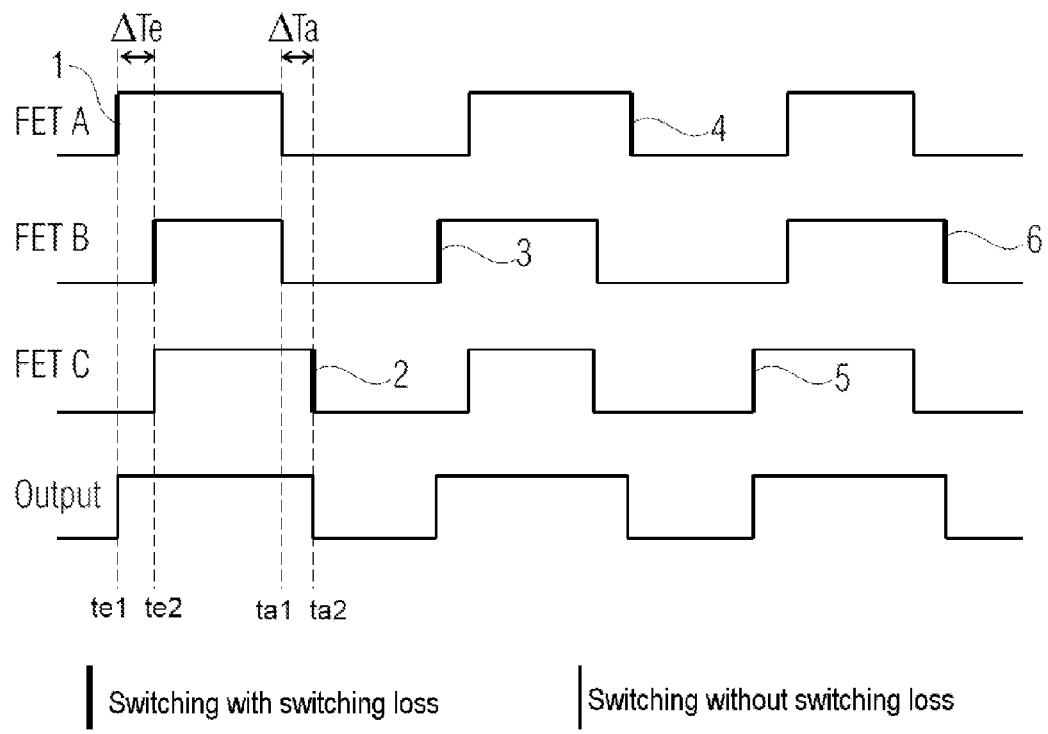
FIG. 1 is an illustration showing a temporal variation of logical switching states of three power transistors connected in parallel and of an output signal of the transistor circuit according to the invention.

FIG. 1 shows a temporal variation of the logical switching states of three power transistors FET A, FET B and FET C connected in parallel. In a first switching cycle shown, FET A switches on before the power transistors FET B and FET C by a switching time difference $\Delta T_e$. The switching-on losses thus occur almost exclusively at FET A in the first cycle which is indicated by edge 1 of the FET A signal. During switching-off, FET A and FET B switch off as the first one, FET C switches off later by a switching time difference $\Delta T_a$ which can be equal to or different from the switching time difference $\Delta T_e$. FET C thus bears the switching-off losses of the first cycle which is indicated by edge 2 of the FET C signal.

In a subsequent second cycle, FET B switches on as the first one and thus bears the switching-on losses at edge 3. FET A switches off as the last one and thus bears the switching-off losses at edge 4.

In a subsequent third cycle, FET C switches on as the first one and thus bears the switching-on losses at edge 5. FET B switches off as the last one and thus bears the switching-off losses at edge 6.

The switching losses in the power transistor circuit balance out over a temporal mean, i.e. they are distributed uniformly to all three existing transistors. There is no overheating of an individual one of the power transistors.

Figure 2:
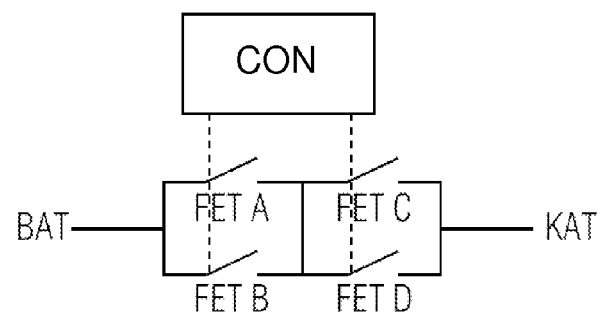
FIG. 2 is an illustration of a power transistor circuit according to one exemplary embodiment.

FIG. 2 shows diagrammatically a power transistor circuit which can be used for heating a catalyzer in an automobile and is connected between a battery and a catalyzer. The circuit consists of a first stage which has the two power transistors FET A and FET B connected in parallel. In series with this, a second stage is connected which has the power transistors FET C and FET D connected in parallel. One of the stages can be provided as a redundant safety facility or emergency off switch. FIG. 2 further shows a control unit CON for controlling the switching of the power transistor circuit.

Figure 3:
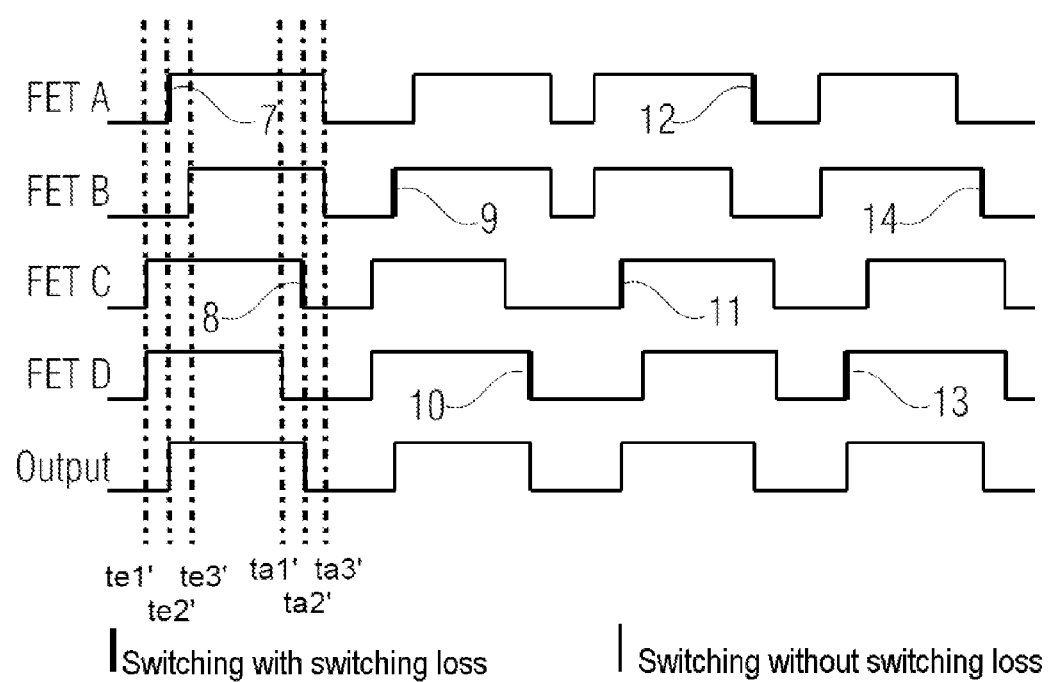
FIG. 3 is an illustration showing the temporal variation of the logical switching states and of the output signal of the power transistor circuit from FIG. 2.

FIG. 3 shows the temporal variation of the logical switching states of the four power transistors FET A, FET B, FET C and FET D of the power transistor circuit from FIG. 2. In a first switching cycle shown, FET A switches the transistor circuit to be conductive first. The switching-on losses thus occur almost exclusively at FET A in the first cycle which is indicated by edge 7 of the FET A signal. During switching-off, FET C switches the transistor circuit to nonconductive. FET C thus bears the switching-off losses of the first cycle which is indicated by edge 8 of the FET C signal.

In a second switching cycle shown, FET B switches the transistor circuit to be conductive first. As a result, FET B heats up as the first one which leads to a lowering of the threshold voltage. The switching-on losses thus occur almost exclusively at FET B in the second cycle which is indicated by edge 9 of the FET B signal. During switching-off, FET D switches the transistor circuit to nonconductive. FET D thus bears the switching-off losses of the second cycle which is indicated by edge 10 of the FET D signal.

In a third switching cycle shown, FET C switches the transistor circuit to be conductive first. The switching-on losses thus occur almost exclusively at FET C in the third cycle which is indicated by edge 11 of the FET C signal. During switching-off, FET A switches the transistor circuit to nonconductive. FET A thus bears the switching-off losses of the third cycle which is indicated by edge 12 of the FET A signal.

In a fourth switching cycle shown, FET D switches the transistor circuit to be conductive first. The switching-on losses thus occur almost exclusively at FET D in the fourth cycle which is indicated by edge 13 of the FET D signal. During switching-off, FET B switches the transistor circuit to nonconductive. FET B thus bears the switching-off losses of the fourth cycle which is indicated by edge 14 of the FET B signal.

On switching with a time offset, the switching losses are allocated selectively to certain transistors. In this context, the switching-on losses occur at a different one of the four power transistors in each of the four cycles. The same applies to the switching-off losses. The switching losses are distributed uniformly to all four existing transistors averaged in time. There is no overheating of an individual one of the power transistors or the risk of such overheating is reduced at least.

The embodiment of the invention is not restricted to these applications and the system configurations mentioned further above but is also possible in a multiplicity of deviations which lie within the framework of expert action. Furthermore, it should be pointed out that reference symbols in the claims are not to be considered to be restrictive and that the terms "exhibit" or "exhibiting" and similar terms do not exclude the presence of further elements or steps. Enumerating as several means or elements does also not exclude that these means or elements can be configured as a single means or element.

The following is a summary list of reference numerals and the corresponding structure used in the above description of the invention:

1 Switching-on with switching loss in the first cycle
2 Switching-off with switching loss in the first cycle
3 Switching-on with switching loss in the second cycle
4 Switching-off with switching loss in the second cycle
5 Switching-on with switching loss in the third cycle
6 Switching-off with switching loss in the third cycle
7 Switching-on with switching loss in the first cycle
8 Switching-off with switching loss in the first cycle
9 Switching-on with switching loss in the second cycle
10 Switching-off with switching loss in the second cycle
11 Switching-on with switching loss in the third cycle
12 Switching-off with switching loss in the third cycle
13 Switching-on with switching loss in the fourth cycle
14 Switching-off with switching loss in the fourth cycle

The invention claimed is:

1. A method for switching a cycle in a power transistor circuit having power transistors connected in parallel with one another and including a first power transistor, a second power transistor and at least one third power transistor, which comprises the steps of:
   specifying a switching time difference of greater than zero between a first switching-on time and a second switching-on time for a first switching cycle;
   switching on the first power transistor at the first switching-on time;
   switching on at least two other ones of the power transistors at the second switching-on time;
   specifying a further switching time difference of greater than zero between a first switching-off time and a second, subsequent switching-off time for the first switching cycle;
   switching-off of the first power transistor switched on at first and one of the power transistors, which were switched on at the second switching-on time, at the first switching-off time;
   switching off the other one of the power transistors, which was switched-on at the second switching-on time at the second, subsequent switching-off time; and
   wherein, in successive switching cycles, the power transistors to be switched at first switching-on times and second switching-off times change cyclically.

2. A control unit for switching a cycle in a power transistor circuit, the power transistor circuit having power transistors connected in parallel with one another and including a first power transistor, a second power transistor and at least one third power transistor, the control unit programmed to perform the steps of:
   specifying a switching time difference of greater than zero between a first switching-on time and a second switching-on time for a first switching cycle;
   switching on the first power transistor at the first switching-on time;
   switching on at least two other ones of the power transistors at the second switching-on time;
   specifying a further switching time difference of greater than zero between a first switching-off time and a second, subsequent switching-off time for the first switching cycle;
   switching-off of the first power transistor switched on at first and one of the power transistors, which were switched on at the second switching-on time, at the first switching-off time;
   switching off the other one of the power transistors, which was switched-on at the second switching-on time at the second, subsequent switching-off time; and
   wherein, in successive switching cycles, the power transistors to be switched at first switching-on times and second switching-off times change cyclically.

* * * * *